United States Patent
Utsunomiya et al.

(10) Patent No.: US 9,825,658 B2
(45) Date of Patent: Nov. 21, 2017

(54) DISTORTION COMPENSATION APPARATUS AND DISTORTION COMPENSATION METHOD

(71) Applicant: FUJITSU LIMITED, Kawasaki-shi, Kanagawa (JP)

(72) Inventors: Yuichi Utsunomiya, Kawasaki (JP); Hiroyoshi Ishikawa, Kawasaki (JP); Daisuke Ogawa, Yokosuka (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/081,917

(22) Filed: Mar. 27, 2016

(65) Prior Publication Data
US 2016/0336975 A1 Nov. 17, 2016

(30) Foreign Application Priority Data

May 13, 2015 (JP) .................. 2015-098589

(51) Int. Cl.
*H04B 1/04* (2006.01)
*H03F 1/32* (2006.01)
*H04B 1/62* (2006.01)

(52) U.S. Cl.
CPC ......... *H04B 1/0475* (2013.01); *H03F 1/3241* (2013.01); *H04B 1/62* (2013.01); *H04B 2001/0425* (2013.01)

(58) Field of Classification Search
CPC . H03F 1/26; H03F 1/32; H03F 1/3241; H03F 1/3247; H03F 3/20; H03F 3/24; H04B 1/0475; H04B 1/62; H04B 2001/0408; H04B 2001/0416; H04B 2001/0425; H04B 2001/0433; H04L 27/367; H04L 27/368
USPC ............ 375/254, 285, 296, 297; 381/94.1; 455/501, 67.13, 114.2, 114.3
See application file for complete search history.

(56) References Cited

U.S. PATENT DOCUMENTS

| | | | | |
|---|---|---|---|---|
| 2006/0262879 | A1* | 11/2006 | Smith | H03G 3/3047 375/297 |
| 2010/0156530 | A1* | 6/2010 | Utsunomiya | H03F 1/3247 330/149 |
| 2012/0098596 | A1 | 4/2012 | Nagatani et al. | |
| 2014/0010330 | A1* | 1/2014 | Shizawa | H04B 1/0475 375/296 |
| 2014/0072074 | A1* | 3/2014 | Utsunomiya | H04L 27/368 375/296 |
| 2015/0003563 | A1* | 1/2015 | Matsubara | H04B 1/0475 375/297 |
| 2015/0124904 | A1* | 5/2015 | Shizawa | H03F 1/3247 375/297 |

FOREIGN PATENT DOCUMENTS

JP 2012-090158 5/2012

* cited by examiner

*Primary Examiner* — Young T Tse
(74) *Attorney, Agent, or Firm* — Fujitsu Patent Center

(57) ABSTRACT

A distortion compensation apparatus includes a retention unit that retains a coefficient for distortion compensation for each of a plurality of time segments of a burst signal that keeps a constant power level, and a distortion compensation unit that, by using a coefficient for a time segment that corresponds to elapsed time from a head of the burst signal among the coefficients retained by the retention unit, executes distortion compensation for the time segment.

8 Claims, 8 Drawing Sheets

DISTORTION COMPENSATION APPARATUS AND DISTORTION COMPENSATION METHOD

CROSS-REFERENCE TO RELATED APPLICATION

This application is based upon and claims the benefit of priority of the prior Japanese Patent Application No. 2015-098589, filed on May 13, 2015, the entire contents of which are incorporated herein by reference.

FIELD

The embodiments discussed herein are related to a distortion compensation apparatus and a distortion compensation method.

BACKGROUND

A transmission apparatus used in a radio communication system typically includes a power amplifier for amplifying a transmission signal. In a case where power of an input signal is relatively small, the power amplifier applies linear amplification to the input signal. Accordingly, linearity of input power and output power is maintained. In a case where power of the input signal is relatively great, however, the power reaches a saturation region of an input/output characteristic and causes linearity of input power and output power to be impaired. As a result, operating a power amplifier in a saturation region with high efficiency typically causes nonlinear distortion in a transmission signal amplified by the power amplifier. Nonlinear distortion can be a factor of an increase in an adjacent channel leakage ratio (ACLR), and thus, it is desirable to reduce nonlinear distortion.

To cope with this, there is a case where a transmission apparatus employs a distortion compensation technique using a predistortion method. In this method, nonlinear distortion is compensated by previously adding, to a transmission signal, distortion having inverse characteristics of nonlinear distortion generated in a power amplifier. The distortion previously added to the transmission signal in the predistortion method is also referred to as a distortion compensation coefficient, or the like. For example, a distortion compensation coefficient corresponding to a power level of the transmission signal is read from a look-up table and multiplied with the transmission signal. Thereafter, the transmission signal multiplied with the distortion compensation coefficient is amplified by the power amplifier. With this process, the distortion caused by the distortion compensation coefficient is cancelled by nonlinear distortion generated by the power amplifier, reducing the distortion in the transmission signal.

An output of the power amplifier is fed back and used for updating the distortion compensation coefficient stored in the look-up table. Specifically, the distortion compensation coefficient is updated so as to reduce an error between a feedback signal from the power amplifier and an original transmission signal before being multiplied with the distortion compensation coefficient, leading to improvement in distortion compensation accuracy. This attempt to improve distortion compensation accuracy includes consideration of performing distortion compensation using a distortion compensation coefficient for coping with a memory effect that corresponds to nonlinearity depending upon an effect of a transmission signal input to the power amplifier in the past.

[Patent Document 1] Japanese Laid-open Patent Publication No. 2012-90158

Meanwhile, distortions generated in a transmission signal include not only nonlinear distortion generated in a power amplifier but also burst distortion, namely, distortion generated in a burst signal transmitted in time division duplex (TDD) communication, or the like. Burst distortion is distortion that causes power to increase when the burst signal rises and causes power to decrease when time elapses. Specifically, at the time of starting transmission of the burst signal, the power amplifier starts operation and warms up rapidly. This causes power of the burst signal to increase remarkably for about 50 nanoseconds (ns) from start of transmission. When several tens to several hundred milliseconds (ms) have elapsed after start of transmission, the entire power amplifier warms up. This causes the gain to gradually decrease and thus, causes the power of the burst signal to gradually decrease. Such a phenomenon in which a signal power changes corresponding to elapsed time is generally known as a droop phenomenon.

Unfortunately, however, it is difficult to compensate this type of burst distortion by the predistortion method, leading to a problem of limited improvement in distortion compensation performance of the transmission apparatus. Specifically, distortion compensation using the predistortion method, as described above, feeds back an output of the power amplifier thereby updating the distortion compensation coefficient. With such an updating procedure of the distortion compensation coefficient, however, it is difficult to properly update the distortion compensation coefficient against the burst distortion. As a result, the distortion compensation using the predistortion method would not sufficiently compensate burst distortion, possibly leading to distortion persisting in the burst signal amplified by the power amplifier.

Hereinafter, this issue will be described more specifically with reference to FIG. 10. FIG. 10 is a diagram illustrating a specific example of a time waveform of a burst signal. As illustrated in FIG. 10, a burst signal 10 and a burst signal 20 are intermittently generated with a predetermined time interval. At a rising portion of each of the burst signal 10 and the burst signal 20, power is temporarily increased by burst distortion. The power gradually decreases as time elapses. In a case where the predistortion method is applied to this type of burst distortion, update of a distortion compensation coefficient is executed at a segment where each of the burst signals 10 and 20 is generated. Specifically, at an ending portion 11 of the burst signal 10, for example, update of the distortion compensation coefficient is executed so as to compensate burst distortion at the ending portion 11. Therefore, at the time of completion of transmission of the burst signal 10, a distortion compensation coefficient to be stored in a look-up table has become a coefficient that corresponds to the burst distortion at the ending portion 11.

When transmission of the burst signal 20 is started, burst distortion at a head portion 21 is compensated by a distortion compensation coefficient. At this time, even though burst distortion has remarkably been increased at the head portion 21, the distortion compensation coefficient stored in the look-up table corresponds to the burst distortion at the ending portion 11 of the burst signal 10. This causes a failure in sufficiently compensating the burst distortion of the head portion 21 of the burst signal 20 and causes burst distortion of the burst signal 20 to persist. This means it is difficult to sufficiently compensate burst distortion by the predistortion method immediately after starting transmission of the burst signal 20.

Meanwhile, other than a technique to read a distortion compensation coefficient from a look-up table to perform distortion compensation, the predistortion method has another technique, for example, to previously add distortion to a transmission signal using a polynomial. Also with this type of technique using a polynomial, a coefficient of the polynomial is updated by feedback of an output of the power amplifier, and thus, it is still difficult to properly compensate the burst distortion.

SUMMARY

According to an aspect of an embodiment, a distortion compensation apparatus includes: a retention unit that retains a coefficient for distortion compensation for each of a plurality of time segments of a burst signal that keeps a constant power level; and a distortion compensation unit that, by using a coefficient for a time segment that corresponds to elapsed time from a head of the burst signal among the coefficients retained by the retention unit, executes distortion compensation for the time segment.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Preferred embodiments of the present invention will be explained with reference to accompanying drawings. The present invention is not limited to the present embodiments.

[a] First Embodiment

Figure 1:
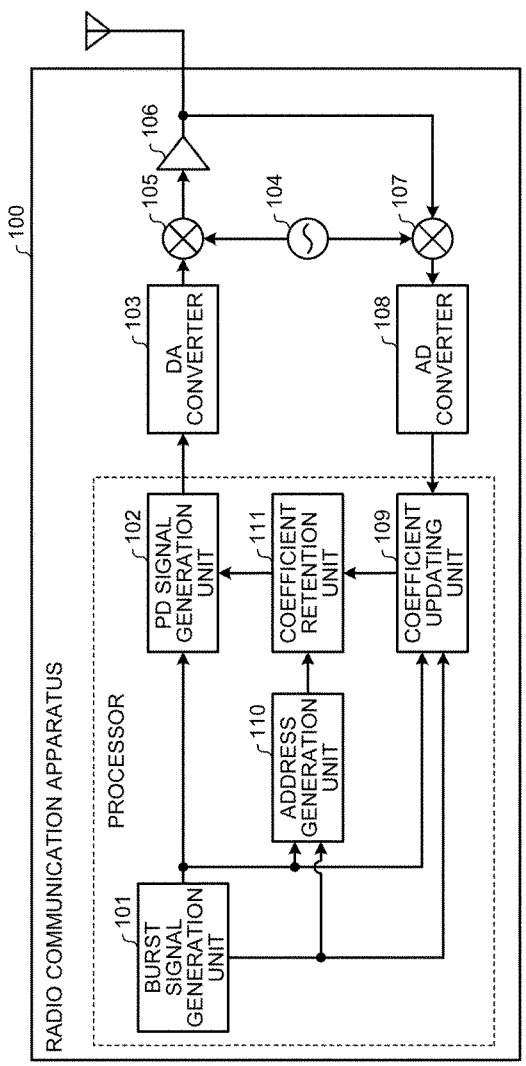
FIG. 1 is a block diagram illustrating a configuration of a radio communication apparatus according to a first embodiment.

FIG. 1 is a block diagram illustrating a configuration of a radio communication apparatus 100 according to a first embodiment. The radio communication apparatus 100 illustrated in FIG. 1 includes a burst signal generation unit 101, a predistortion signal (hereinafter, abbreviated as a PD signal) generation unit 102, a digital-analog (DA) converter 103, an oscillator 104, a mixer 105, and a power amplifier 106. Each of the burst signal generation unit 101 to the power amplifier 106 is included in a transmission system of the radio communication apparatus 100. The radio communication apparatus 100 also has a feedback system including a mixer 107 and an analog-digital (AD) converter 108. The radio communication apparatus 100 further includes a coefficient updating unit 109, an address generation unit 110, and a coefficient retention unit 111. Note that the burst signal generation unit 101, the PD signal generation unit 102, the coefficient updating unit 109, the address generation unit 110, and the coefficient retention unit 111 are included in a processor equipped with, for example, a central processing unit (CPU), a field programmable gate array (FPGA), or a digital processing unit (DSP).

The burst signal generation unit 101 generates a burst signal including transmission data. The burst signal is a signal that keeps a constant power level for a predetermined period and is intermittently transmitted, for example, in TDD communication. The burst signal generation unit 101 transmits a generated burst signal to the PD signal generation unit 102. The burst signal generation unit 101 outputs elapsed time information indicating elapsed time after starting transmission of a burst signal to the PD signal generation unit 102, to the coefficient updating unit 109 and the address generation unit 110. The burst signal is a signal that keeps a constant power level for a predetermined period. Accordingly, the burst signal generation unit 101 outputs elapsed time information indicating elapsed time after starting output of power of a predetermined level to the coefficient updating unit 109 and the address generation unit 110.

The PD signal generation unit 102 multiplies a distortion compensation coefficient that is output from the coefficient retention unit 111 with each of samples of the burst signal and thereby generating a PD signal to which distortion has been added. At this time, the PD signal generation unit 102 multiplies a distortion compensation coefficient not only to a current sample of the burst signal but also to a past sample of the burst signal and adds the samples, so as to generate a PD signal to which consideration of memory effect has been given. The distortion compensation coefficient that is multiplied to each of the samples of the burst signal corresponds to a nonlinear distortion generated in the power amplifier 106 and burst distortion that changes according to elapsed time of the burst signal. Accordingly, the PD signal generated by the PD signal generation unit 102 is a signal in which both nonlinear distortion and burst distortion have been compensated.

The DA converter 103 performs DA conversion of the PD signal generated by the PD signal generation unit 102 and outputs an obtained analog signal to the mixer 105.

The oscillator 104 generates a local signal of a predetermined frequency. Specifically, the oscillator 104 generates a radio frequency local signal and outputs the signal to the mixer 105, and together with this operation, generates a baseband frequency local signal and outputs it to the mixer 107.

The mixer 105, using the radio frequency local signal generated by the oscillator 104, upconverts an analog signal that is output from the DA converter 103. Subsequently, the mixer 105 outputs an obtained radio signal to the power amplifier 106.

The power amplifier 106 amplifies the radio signal that is output from the mixer 105 and transmits via an antenna, and together with this operation, feeds the signal back to the mixer 107. At this time, nonlinear distortion and burst distortion are generated at the power amplifier 106. However, since the signal input into the power amplifier 106 has been previously distortion-compensated at the PD signal generation unit 102, the nonlinear distortion and the burst distortion are cancelled.

The mixer 107, using a baseband frequency local signal generated by the oscillator 104, downconverts the radio signal fed back from the power amplifier 106. The mixer 107, subsequently outputs an obtained baseband signal to the AD converter 108.

The AD converter 108 performs AD conversion of the baseband signal output from the mixer 107, and outputs the obtained digital baseband signal to the coefficient updating unit 109.

The coefficient updating unit 109 updates the distortion compensation coefficient stored in the coefficient retention unit 111 so as to reduce an error between the burst signal generated by the burst signal generation unit 101 and the baseband signal that is output from the AD converter 108. As described below, the coefficient retention unit 111 retains a plurality of coefficient groups corresponding to the elapsed time of a burst signal. Therefore, the coefficient updating unit 109 updates the distortion compensation coefficient of the coefficient group corresponding to the elapsed time with reference to elapsed time information that is output from the burst signal generation unit 101.

The address generation unit 110 generates an address used to read the distortion compensation coefficient based on the elapsed time information of the burst signal transmitted from the burst signal generation unit 101 and based on instantaneous power. Specifically, the address generation unit 110 selects a coefficient group corresponding to the elapsed time of the burst signal, and at the selected coefficient group, generates an address for specifying the distortion compensation coefficient corresponding to a sample timing of the burst signal. Furthermore, in order to cope with a memory effect, the address generation unit 110 selects a coefficient group corresponding to the elapsed time not only on a current sample of the burst signal but also on a past sample of the burst signal, and generates an address for specifying the distortion compensation coefficient corresponding to the sample timing. Subsequently, the address generation unit 110 notifies the addresses that correspond to the current and past samples to the coefficient retention unit 111.

Figure 2:
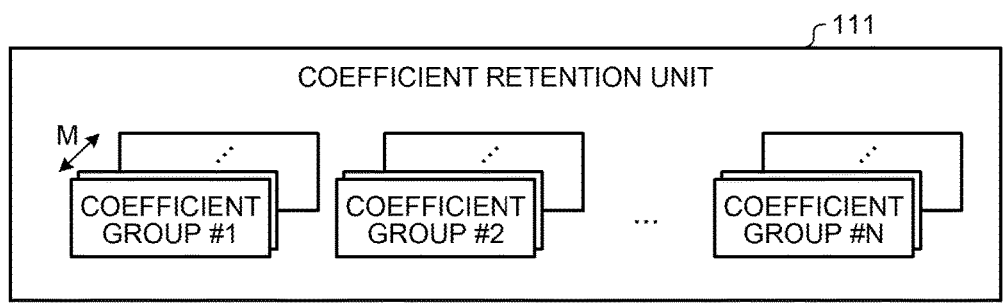
FIG. 2 is a diagram illustrating a configuration of a coefficient retention unit according to the first embodiment.

The coefficient retention unit 111 stores a distortion compensation coefficient used to compensate a nonlinear distortion and burst distortion of a burst signal. Subsequently, the coefficient retention unit 111 outputs the distortion compensation coefficient stored in an address notified from the address generation unit 110 to the PD signal generation unit 102. Specifically, the coefficient retention unit 111, as illustrated in FIG. 2, includes N sets (N is an integer of two or more) of coefficient groups #1 to #N corresponding to the elapsed time of the burst signal. Each of the coefficient groups #1 to #N corresponds, for example, to each of segments obtained by dividing a time length of the burst signal by N. Accordingly, a coefficient group #1 is, for example, a coefficient group corresponding to a head segment of the burst signal. A coefficient group #N is a coefficient group corresponding to an end segment of the burst signal.

Each of the coefficient groups #1 to #N has M (M is an integer of two or more) distortion compensation coefficients. Each of the distortion compensation coefficients corresponds to a sample timing of the burst signal. For example, the distortion compensation coefficient in a first place from the top in each of the coefficient groups corresponds to a current sample of the burst signal. The distortion compensation coefficient in a second place from the top corresponds to a sample that is one-sample past of the burst signal.

In this manner, the coefficient retention unit 111 retains the plurality of coefficient groups #1 to #N corresponding to the elapsed time of the burst signal. Each of the coefficient groups #1 to #N includes the plurality of (M) distortion compensation coefficients corresponding to current to past samples of the burst signal. In relation to the plurality of samples to be used for distortion compensation of the current sample of the burst signal, an address corresponding to the elapsed time and sample timing for each of samples is output from the address generation unit 110. For this reason, the coefficient retention unit 111 outputs a distortion compensation coefficient corresponding to a sample timing of each of the samples selected from among different coefficient groups corresponding to the elapsed time of the burst signal, to the PD signal generation unit 102.

Figure 3:
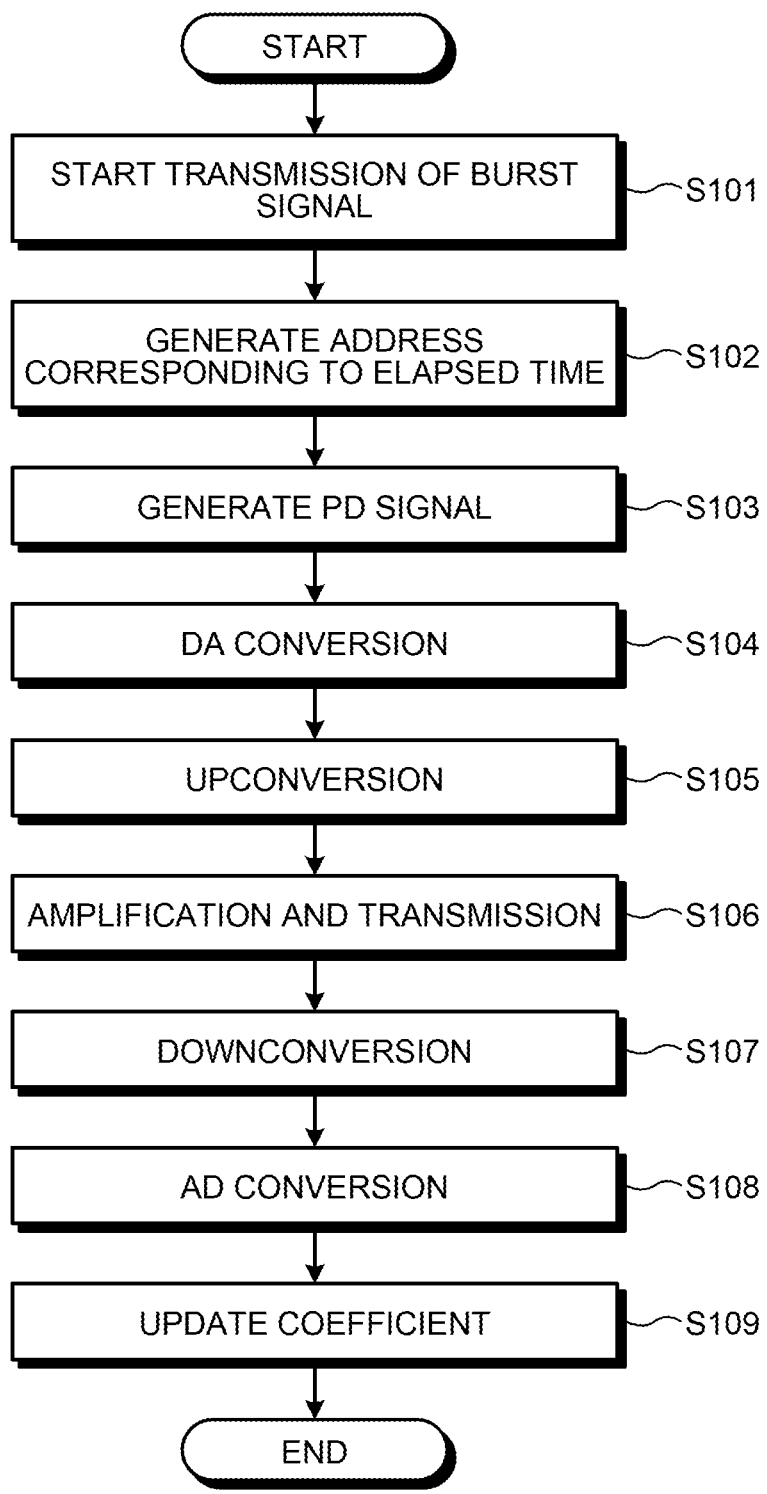
FIG. 3 is a flowchart illustrating distortion compensation processing according to the first embodiment.

Next, distortion compensation processing in the above-configured radio communication apparatus 100 will be described with reference to the flowchart illustrated in FIG. 3.

In a case where the radio communication apparatus 100 transmits a burst signal, the burst signal generation unit 101 generates the burst signal that keeps a constant power level for a predetermined period. When transmission of the generated burst signal from the burst signal generation unit 101 is started (step S101), the power that keeps a constant level for a predetermined period is output from the burst signal generation unit 101. The burst signal generation unit 101 outputs elapsed time information indicating elapsed time after starting transmission of the burst signal, to the coefficient updating unit 109 and the address generation unit 110.

After the elapsed time information has been input into the address generation unit 110, the address generation unit 110 generates an address corresponding to the elapsed time of the burst signal based on the elapsed time information (step S102). Specifically, the address generation unit 110 selects a coefficient group that corresponds to a segment to which the elapsed time after start of transmission of the burst signal belongs among the segments obtained by dividing a whole segment of a burst signal by N, and at the selected coefficient group, generates an address for specifying the distortion compensation coefficient corresponding to a sample timing of the burst signal. Accordingly, for a duration when the elapsed time belongs to a head segment, for example, the address generation unit 110 selects a coefficient group #1 of the coefficient retention unit 111, and at the coefficient group #1, generates an address for specifying the distortion compensation coefficient corresponding to the current sample.

Each of the coefficient groups includes not only a distortion compensation coefficient corresponding to the current sample but also a distortion compensation coefficient corresponding to a past sample. Furthermore, in order to perform compensation of nonlinear distortion due to an influence of a memory effect, the address generation unit 110 selects a coefficient group corresponding to the segment to which the sample including the past sample of the burst signal belongs and generates an address for specifying the distortion compensation coefficient corresponding to the sample timing of the sample. In other words, an address generated by the address generation unit 110 is an address for selecting a coefficient group corresponding to a segment to which a sample of a burst signal belongs, and for selecting a distortion compensation coefficient corresponding to a sample timing at the selected coefficient group.

For example, in a case where the current sample is included in the second segment from the head of a burst signal, an address related to the distortion compensation coefficient in a first place from the top in the coefficient group #2, as illustrated in FIG. 2, is generated as an address corresponding to the current sample. Subsequently, an address related to the distortion compensation coefficient in a second place from the top in the coefficient group #2, as illustrated in FIG. 2, is generated as an address corresponding to the past sample. Similarly to the above, an address for specifying a distortion compensation coefficient corresponding to a sample timing of a coefficient group that corresponds to a segment to which each of the samples belong is generated.

Subsequently, the address generated corresponding to the current and past sample is output to the coefficient retention unit 111. The distortion compensation coefficient specified by each of the addresses is output to the PD signal generation unit 102. The distortion compensation coefficient that corresponds to each of the samples is multiplied with the corresponding sample by the PD signal generation unit 102. With addition of a result of multiplication, a PD signal is generated (step S103). In other words, a sample of the PD signal is generated by giving consideration of an influence of a memory effect due to the past sample to the current sample of a burst signal, and by using a distortion compensation coefficient that corresponds to the elapsed time after start of transmission of the burst signal.

The PD signal generated in this manner is DA converted by the DA converter 103 (step S104), and is upconverted by the mixer 105 (step S105). Subsequently, a radio signal obtained by upconversion is amplified by the power amplifier 106 and transmitted via an antenna (step S106). Nonlinear distortion and burst distortion are generated in amplification at the power amplifier 106. However, since distortion compensation corresponding to the elapsed time of the burst signal has been performed by the PD signal generation unit 102, the nonlinear distortion and the burst distortion are cancelled.

While being transmitted via an antenna, the radio signal is also fed back to the mixer 107 and downconverted by the mixer 107 (step S107). A baseband signal obtained by downconversion is AD converted by the AD converter 108 (step S108), and then, input into the coefficient updating unit 109. At the coefficient updating unit 109, a baseband signal that has been fed back is compared with a burst signal generated by the burst signal generation unit 101, and the distortion compensation coefficient stored in the coefficient retention unit 111 is updated so as to reduce an error between the both signals (step S109). At this time, with reference to the elapsed time information, the coefficient updating unit 109 updates a distortion compensation coefficient of the coefficient group that has been used for distortion compensation of the sample of the burst signal. For example, when a sample of the burst signal that has been distortion-compensated by the distortion compensation coefficient of the coefficient group #1 in FIG. 2 has been compared with the sample of the baseband signal by the coefficient updating unit 109, the distortion compensation coefficient of the coefficient group #1 is updated.

Figure 4:
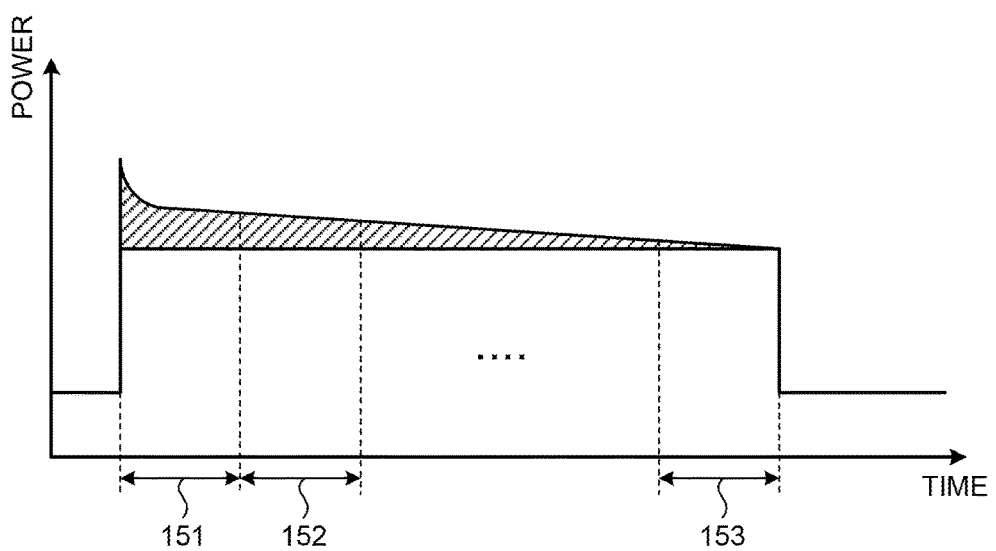
FIG. 4 is a diagram illustrating a using timing of a coefficient group according to the first embodiment.

In this manner, according to the present embodiment, the coefficient retention unit 111 retains N sets of coefficient groups #1 to #N corresponding to each of segments, that is, segments obtained by dividing a whole segment of a burst signal by N. As illustrated in FIG. 4, distortion compensation is performed for a segment 151, namely, a head segment of the burst signal, by using a coefficient group #1. Distortion compensation is performed for a segment 152, namely, a second segment from the head of the burst signal, by using a coefficient group #2. Furthermore, distortion compensation is performed for an end segment 153 of the burst signal using a coefficient group #N. In this manner, distortion compensation using different coefficient groups corresponding to elapsed time of a burst signal is performed, making it possible to sufficiently compensate burst distortion, as indicated by a hatched area in FIG. 4, that changes according to the elapsed time of the burst signal.

As described above, according to the present embodiment, different coefficient groups are retained for each of elapsed times of a burst signal, and addresses are generated corresponding to the elapsed time of the burst signal, and with this configuration, distortion compensation using the coefficient group for each of the elapsed times is executed. This configuration makes it possible to perform both compensation for nonlinear distortion using the predistortion method and compensation for burst distortion that changes according to the elapsed time. As a result, it is possible to sufficiently compensate burst distortion and to improve distortion compensation performance.

[b] Second Embodiment

A feature of a second embodiment is that a distortion compensation coefficient for nonlinear distortion and a distortion compensation coefficient for burst distortion are stored separately and combined with each other so as to execute distortion compensation of a burst signal.

The configuration of a radio communication apparatus according to the second embodiment is similar to the configuration of the first embodiment (FIG. 1), and thus, description will be omitted. In the second embodiment, the configuration of the coefficient retention unit 111 differs from the case in the first embodiment.

Figure 5:
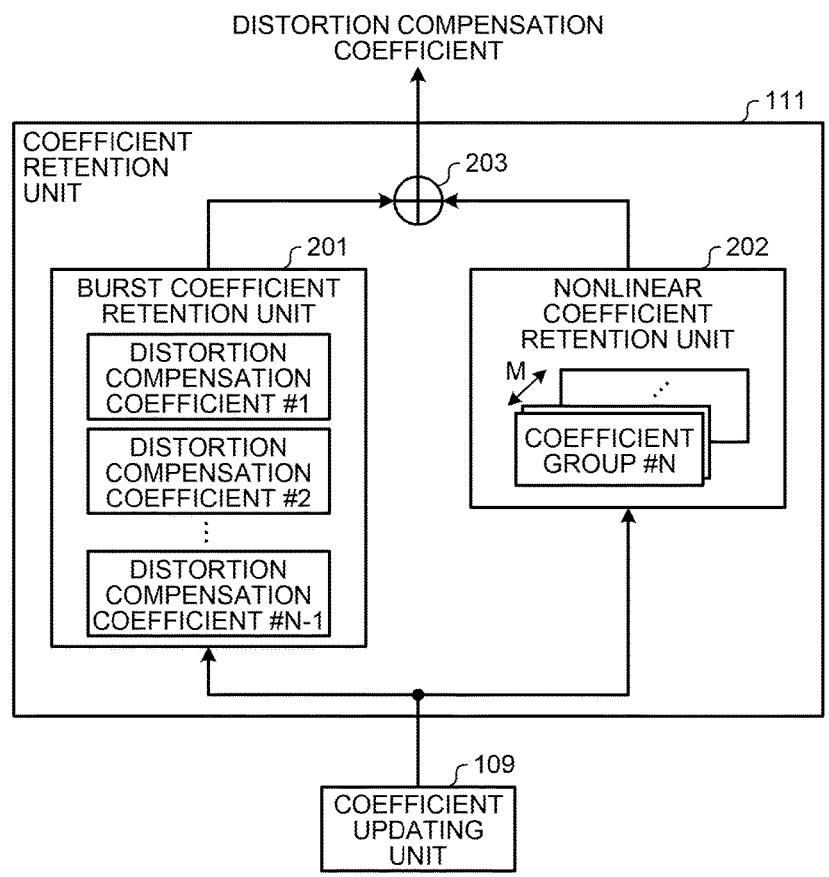
FIG. 5 is a diagram illustrating a configuration of a coefficient retention unit according to a second embodiment.

FIG. 5 is a diagram illustrating a configuration of the coefficient retention unit 111 according to the second embodiment. As illustrated in FIG. 5, the coefficient retention unit 111 includes a burst coefficient retention unit 201, a nonlinear coefficient retention unit 202, and a combining unit 203.

The burst coefficient retention unit 201 stores a distortion compensation coefficient used to compensate burst distortion that changes according to elapsed time of a burst signal (hereinafter, referred to as a burst coefficient). Specifically, the burst coefficient retention unit 201 retains, among segments obtained by dividing a whole segment of a burst signal by N, distortion compensation coefficients #1 to #N−1, namely, coefficients corresponding to (N−1) segments ranging from a head to N−1th segment. Each of the distortion compensation coefficients corresponds to distortion having inverse characteristics of the burst distortion.

The nonlinear coefficient retention unit 202 stores a distortion compensation coefficient used to compensate nonlinear distortion that is unrelated to the elapsed time of the burst signal (hereinafter, referred to as a nonlinear coefficient). Specifically, the nonlinear coefficient retention unit 202, retains, among segments obtained by dividing a whole segment of a burst signal by N, a coefficient group #N that corresponds to an end segment on which burst distortion is minimum. The coefficient group #N includes M nonlinear coefficients corresponding to sample timings of the samples for the current to past of the burst signal. For example, a nonlinear coefficient in a first place from the top in the coefficient group #N corresponds to a current sample of the burst signal. A nonlinear coefficient in a second place from the top corresponds to a sample that is one-sample past of the burst signal. In this manner, the nonlinear coefficient retention unit 202 stores a nonlinear coefficient for each of the sample timings in order to compensate nonlinear distortion in consideration of a memory effect.

The combining unit 203 combines a burst coefficient that is output from the burst coefficient retention unit 201 according to an address and a nonlinear coefficient that is output from the nonlinear coefficient retention unit 202 according to an address and outputs an obtained distortion compensation coefficient to the PD signal generation unit 102.

According to the present embodiment, among the segments obtained by dividing the whole segment of the burst signal by N, distortion generated in the end segment is compensated as nonlinear distortion using a nonlinear coefficient retained in the nonlinear coefficient retention unit 202. In addition, regarding 1st to (N−1)th segments, distortion compensation using a nonlinear coefficient is performed, and together with this, burst distortion compensation using a burst coefficient retained in the burst coefficient retention unit 201 is performed. That is, the nonlinear coefficient and the burst coefficient that is output corresponding to the segment of the burst signal are combined by the combining unit 203, making it possible to obtain a distortion compensation coefficient for compensating a sample of each of segments of the burst signal.

At this time, the address generation unit 110 generates an address for specifying a burst coefficient that corresponds to elapsed time of the burst signal with reference to elapsed time information. This address specifies a nonlinear coefficient that corresponds to a sample timing of the coefficient group #N retained in the nonlinear coefficient retention unit 202. As a result of combining the burst coefficient and the nonlinear coefficient specified by the address by the combining unit 203, a distortion compensation coefficient that compensates both the burst distortion and the nonlinear distortion is obtained.

Note that in the present embodiment, by storing the burst coefficient and the nonlinear coefficient separately, it would be sufficient for the burst coefficient retention unit 201 to store (N−1) distortion compensation coefficients ranging from a head to (N−1)th of the burst signal. Compared with the first embodiment, in which the coefficient retention unit 111 stores (N×M) distortion compensation coefficients, it would be sufficient for the coefficient retention unit 111 to store {(N−1)+M} distortion compensation coefficients in the second embodiment. As a result, it is possible reduce a scale of the coefficient retention unit 111, and thus, to reduce a circuit scale.

Next, update timings of the burst coefficient and the nonlinear coefficient according to the second embodiment will be described with reference to FIG. 6.

In the present embodiment, similarly to the first embodiment, a radio signal that is output from the power amplifier 106 is fed back and compared with a burst signal by the coefficient updating unit 109. With this procedure, the burst coefficient and the nonlinear coefficient stored in the coefficient retention unit 111 are updated. The nonlinear coefficient is a coefficient to compensate nonlinear distortion that is unrelated to elapsed time of a burst signal. Accordingly, as illustrated in FIG. 6, update of a nonlinear coefficient of a coefficient group #N is executed in a whole segment 251 of a burst signal 1, for example. In contrast, the burst coefficient is a coefficient to compensate burst distortion that changes according to elapsed time of a burst signal. Accordingly, as illustrated in FIG. 6, the burst coefficient to be a target of update differs for each of the segments of a burst signal 2, for example. Specifically, among the segments obtained by dividing a whole segment of the burst signal 2 by N, a burst coefficient #1 is updated at a head segment 252, and a burst coefficient #2 is updated at a segment 253, namely, a second segment from the head of the burst signal 2. At an end segment 254, update of the coefficient group #N retained in the nonlinear coefficient retention unit 202, not a burst coefficient, is executed.

In this manner, for the burst coefficient, the distortion compensation coefficients #1 to #N−1 corresponding to each of segments of the burst signal is updated on each of the segments, and for the nonlinear coefficient, the coefficient group #N is updated on the whole segment of the burst signal or at the end segment on which the burst distortion is minimum. With this configuration, it is possible to keep the burst coefficient and the nonlinear coefficient in optimum states.

Figure 6:
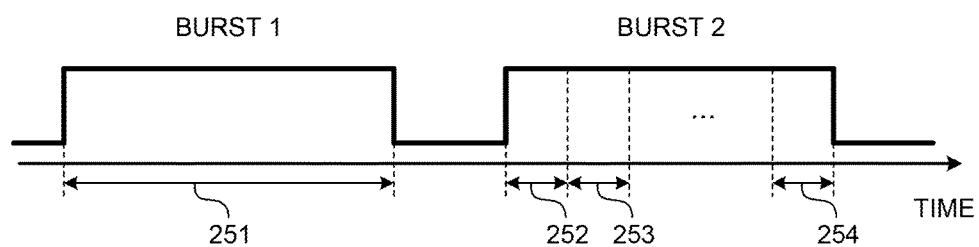
FIG. 6 is a diagram illustrating a coefficient updating timing.

In FIG. 6, the nonlinear coefficient of the coefficient group #N is updated in the whole segment 251 of the burst signal 1. However, there is no need to provide such a burst signal for updating the nonlinear coefficient. In other words, like an update using the burst signal 2, each of the distortion compensation coefficients #1 to #N−1 that corresponds to each of the segments, and the coefficient group #N, may be updated on each of segments of all the burst signals. Furthermore, it is also possible to update any one of the distortion compensation coefficients #1 to #N−1 and the coefficient group #N for each of the burst signals.

As described above, according to the present embodiment, the distortion compensation coefficient used to compensate burst distortion that is different according to each of elapsed time of the burst signal and the coefficient group used to compensate nonlinear distortion unrelated to the elapsed time are retained separately from each other, so as to execute distortion compensation for both burst distortion and nonlinear distortion. Accordingly, it is possible to reduce the number of distortion compensation coefficients stored to compensate burst distortion and nonlinear distortion by the predistortion method, and thus to reduce the circuit scale.

[c] Third Embodiment

A feature of a third embodiment is that a distortion compensation coefficient for compensating nonlinear distortion initially at a time of activation of a radio communication apparatus, or the like, is updated collectively, and thereafter a distortion compensation coefficient for compensating burst distortion is updated.

The configuration of a radio communication apparatus according to the third embodiment is similar to the configuration of the first embodiment (FIG. 1), and thus, description will be omitted. The configuration of the coefficient retention unit 111 according to the third embodiment is similar to the case of the second embodiment (FIG. 5), and thus, description will be omitted. In the third embodiment, operation when the radio communication apparatus 100 is activated differs from the operation in the first and second embodiments.

Figure 7:
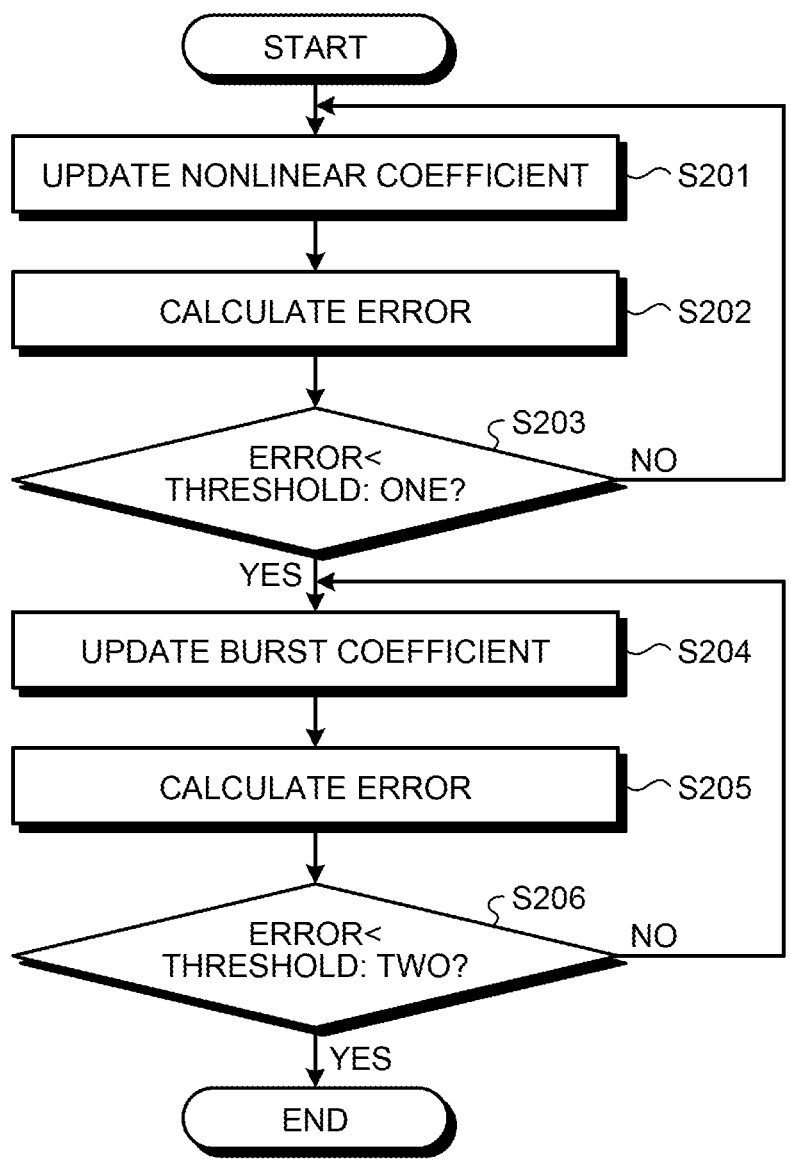
FIG. 7 is a flowchart illustrating initial coefficient updating processing according to a third embodiment.

FIG. 7 is a flowchart illustrating initial coefficient updating processing according to a third embodiment.

At a time of activation, or the like, of the radio communication apparatus 100, an initial value of a distortion compensation coefficient has been stored in the burst coefficient retention unit 201 and the nonlinear coefficient retention unit 202 of the coefficient retention unit 111. The initial value is not a distortion compensation coefficient that sufficiently compensates burst distortion or nonlinear distortion. Therefore, it is desirable to perform update processing of distortion compensation coefficient so as to rapidly shift to a state where a proper distortion compensation coefficient is stored. Accordingly, when a burst signal is generated by the burst signal generation unit 101 after the radio communication apparatus 100 has been activated, update of nonlinear coefficient is executed by the coefficient updating unit 109 while having the whole segment of the burst signal to be a target (step S201). That is, update of the coefficient group #N retained in the nonlinear coefficient retention unit 202 is performed so as to reduce an error between the burst signal and a feedback signal fed back from the power amplifier 106. When this processing is repeated by each of samples of the burst signal, an error between the burst signal and the feedback signal is calculated by the coefficient updating unit 109 (step S202), and whether the calculated error is less than a predetermine threshold, namely, less than one, is determined (step S203).

As a result of this determination, in a case where the error is the predetermined threshold or more, namely, one or more (step S203: No), update of the nonlinear coefficient is repeated continuously. In contrast, if the error is less than the predetermined threshold, namely, less than one (step S203: Yes), it is determined that the nonlinear coefficient has converged. Accordingly, update of the burst coefficient is executed by the coefficient updating unit 109 (step S204). That is, update of the distortion compensation coefficients #1 to #N−1 retained in the burst coefficient retention unit 201 is performed so as to reduce an error between the burst signal and the feedback signal. At the time of update of the burst coefficient, compensation of nonlinear distortion using an already converged nonlinear coefficient is executed, and together with this processing, the burst coefficient corresponding to the elapsed time of the burst signal is updated. When this processing is repeated by each of samples of the burst signal, an error between the burst signal and the feedback signal is calculated by the coefficient updating unit 109 (step S205), and then, whether the calculated error is less than a predetermine threshold, namely, less than two, is determined (step S206). Comparison between the error and the predetermined threshold of two may be executed for each of the segments with different burst coefficients used in compensation of the burst distortion.

As a result of this determination, in a case where the error is the predetermined threshold or more, namely, two or more (step S206: No), update of the burst coefficient is repeated continuously. In contrast, if the error is less than the predetermined threshold, namely, less than two (step S206: Yes), it is determined that the nonlinear coefficient and the burst coefficient both have converged. Accordingly, after this, similarly to the first and second embodiments, the state shifts into a steady state, in which a distortion compensation coefficient, as a target of update, is changed for each of burst signals, and a distortion compensation coefficient corresponding to each of segments of each of the burst signals is updated.

At a time of activation of a radio communication apparatus, as described above, according to the present embodiment, a nonlinear coefficient is initially updated and after the error becomes less than a predetermined threshold by convergence of the nonlinear coefficient, the burst coefficient is updated. With this configuration, it is possible to reduce time until the nonlinear coefficient and the burst coefficient have converged and the state shifts into a steady state, and to rapidly start sufficient compensation for the burst distortion and the nonlinear distortion.

In the above-described third embodiment, a shift to update of the burst coefficient is performed in a case where an error between the burst signal and the feedback signal becomes less than a predetermined threshold during update of the nonlinear coefficient. Alternatively, however, the shift to update of the burst coefficient may be performed, for example, after completion of update of a nonlinear coefficient using the predetermine number of burst signals or after completion of predetermined times of or predetermined period of execution of update of a nonlinear coefficient.

[d] Fourth Embodiment

A feature of a fourth embodiment is that distortion compensation coefficients for different power levels are stored according to burst signals with different power levels and that distortion compensation according to the power level of the burst signal is executed.

The configuration of a radio communication apparatus according to the fourth embodiment is similar to the configuration of the first embodiment (FIG. 1), and thus, description will be omitted. In the fourth embodiment, the configuration of the coefficient retention unit 111 differs from the case in the first embodiment.

Figure 8:
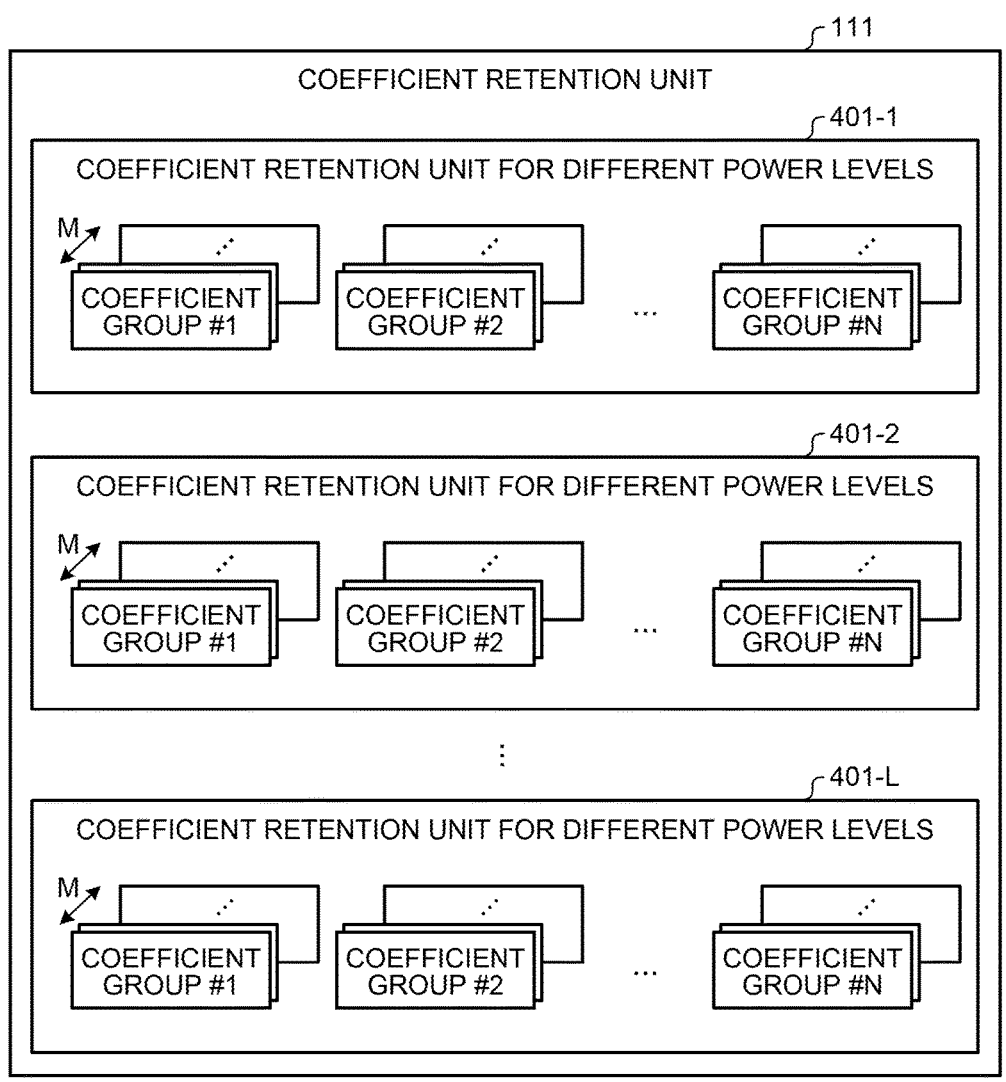
FIG. 8 is a diagram illustrating a configuration of a coefficient retention unit according to a fourth embodiment.

FIG. 8 is a diagram illustrating a configuration of the coefficient retention unit 111 according to the fourth embodiment. As illustrated in FIG. 8, the coefficient retention unit 111 includes a coefficient retention units for different power levels 401-1 to 401-L (L is an integer of two or more).

Each of the coefficient retention units for different power levels 401-1 to 401-L stores each of coefficient groups #1 to #N each storing a distortion compensation coefficient for each of power levels of a burst signal. Each of the coefficient groups #1 to #N corresponds to each of segments obtained by dividing a whole segment of a burst signal by N. Specifically, in the fourth embodiment, burst signals of L types with different power levels are transmitted. Accordingly, each of the coefficient retention units for different power levels 401-1 to 401-L stores a distortion compensation coefficient that corresponds to a power level of each of the burst signals for each of the elapsed times of the burst signal.

In the present embodiment, a burst signal has more than one power levels, and thus, burst signals with different power levels are transmitted from the radio communication apparatus 100. For this reason, power information indicating a power level of a burst signal is notified from the burst signal generation unit 101 to the coefficient updating unit 109 and to the address generation unit 110. Thereafter, the address generation unit 110 generates an address for selecting any of the coefficient retention units for different power levels 401-1 to 401-L corresponding to power levels of the burst signal with reference to the power information. According to this address, similarly to the case of the first embodiment, a coefficient group corresponding to elapsed time of a burst signal is selected and a distortion compensation coefficient that corresponds to a sample timing is specified from among the selected coefficient group. The distortion compensation coefficient specified according to the address is output to the PD signal generation unit 102 and then, distortion compensation for the burst signal is performed. With this configuration, it is possible to sufficiently compensate burst distortion and nonlinear distortion even when the power level of the burst signal changes.

Next, a using timing of a coefficient group according to the fourth embodiment will be described with reference to FIG. 9.

Figure 9:
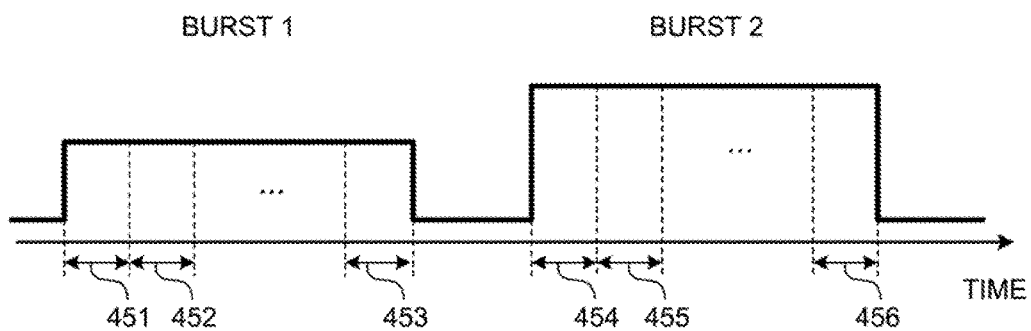
FIG. 9 is a diagram illustrating a using timing of a coefficient group according to the fourth embodiment.
Figure 10:
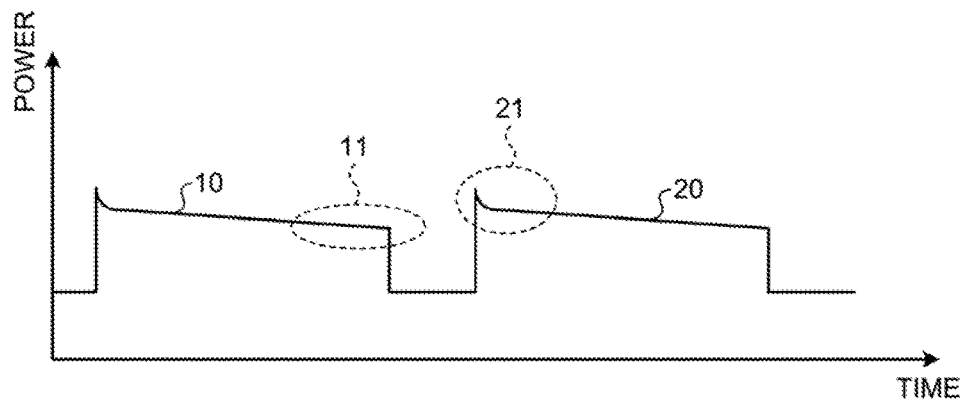
FIG. 10 is a diagram illustrating a specific example of a time waveform of a burst signal.

In the fourth embodiment, as illustrated in FIG. 9, power levels differ in a burst signal 1 and a burst signal 2. Therefore, when the burst signal 1 is transmitted, power information related to the burst signal 1 is notified to the address generation unit 110. Thereafter, an address specifying a coefficient retention unit for different power levels 401-1 corresponding to the power level of the burst signal 1 is generated by the address generation unit 110. In a segment 451 that is a head segment of the burst signal 1, an address for selecting the coefficient group #1 of the coefficient retention unit for different power levels 401-1 is generated. In a segment 452 that is a second segment from the head of the burst signal 1, an address for selecting the coefficient retention group #2 of the coefficient retention unit for different power levels 401-1 is generated. In a similar manner, in a segment 453 that is an end segment of the burst signal 1, an address for selecting the coefficient group #N of the coefficient retention unit for different power levels 401-1 is generated. In this manner, the coefficient retention units for different power levels 401-1 to 401-L are specified based on power information. Other than this point, the present embodiment is similar to the first embodiment in that a coefficient group corresponding to the elapsed time of a burst signal is selected, and then, an address for specifying a distortion compensation coefficient that corresponds to a sample timing is generated.

Meanwhile, when a burst signal 2 that has a different power level from the burst signal 1 is transmitted, power information regarding the burst signal 2 is notified to the address generation unit 110. Subsequently, an address for specifying the coefficient retention unit for different power levels 401-2 that corresponds to the power level of the burst signal 2 is generated by the address generation unit 110. In a segment 454 that is a head segment of the burst signal 2, an address for selecting the coefficient group #1 of the coefficient retention unit for different power levels 401-2 is generated. In a segment 455 that is a second segment from the head of the burst signal 2, an address for selecting the coefficient retention group #2 of the coefficient retention unit for different power levels 401-2 is generated. In a similar manner, in a segment 456 that is an end segment of the burst signal 2, an address for selecting the coefficient group #N of the coefficient retention unit for different power levels 401-2 is generated.

In this manner, addresses for specifying coefficient retention units for different power levels 401-1 to 401-L are generated according to power information indicating a power level of a burst signal. Accordingly, it is possible to compensate burst distortion and nonlinear distortion occurring in burst signals with different power levels.

As described above, according to the present embodiment, different coefficient groups are retained for each of power levels and elapsed times of a burst signal, and addresses are generated corresponding to the power levels and elapsed times of the burst signal, and with this configuration, distortion compensation using the coefficient group for each of the power levels and elapsed times is executed. This configuration makes it possible to perform both compensation for nonlinear distortion using the predistortion method and compensation for burst distortion that changes according to the elapsed time even when the power level of the burst signal changes.

In the above-described fourth embodiment, the coefficient retention unit 111 includes the coefficient retention units for different power levels 401-1 to 401-L for different power levels of a burst signal. Alternatively, it is possible to configure such that a coefficient group that corresponds to a burst signal with a maximum power level is stored alone. That is, since burst distortion tends to increase when the power level of the burst signal increases, it is possible to configure such that a distortion compensation coefficient suitable for the burst signal with a maximum power level is stored alone. In this case, the coefficient updating unit 109, based on power information and in a case where the power level of the burst signal is a maximum power level, updates a coefficient group stored in the coefficient retention unit 111.

The above-described embodiments may be appropriately combined and executed. For example, the second embodiment and the fourth embodiment may be combined such that the coefficient retention unit 111 stores a burst coefficient and nonlinear coefficient for each of power levels of a burst signal. Alternatively, it is possible to combine, for example, the third embodiment and the fourth embodiment such that, at a time of activation of the radio communication apparatus 100, a distortion compensation coefficient for each of power levels is updated by initial coefficient updating processing in the third embodiment.

The above-described embodiments include the predistortion method in which a distortion compensation coefficient has been stored for each of elapsed times of a burst signal and the distortion compensation coefficient is multiplied with each of samples of the burst signal. Alternatively, however, it is possible to configure such that, in a predistortion method using a polynomial, for example, a polynomial coefficient for each of elapsed time of a burst signal is stored and distortion compensation is performed on each of samples of the burst signal using a polynomial of the coefficient that corresponds to a segment to which the sample belongs.

In the above-described embodiments, elapsed time information or power information is output from the burst signal generation unit 101. However, the burst signal generation unit 101 need not be included in the radio communication apparatus 100. For example, in case of a radio communication system in which a base band unit (BBU) and a remote radio head (RRH) are connected via an optical fiber, or the like, the RRH may obtain elapsed time information or power information from the BBU. Furthermore, it is possible to configure such that the RRH monitors input power from an optical fiber, and in a case where the input power becomes a predetermined threshold or more, it is determined that a burst signal has been received from the BBU, and then, the elapsed time information may be obtained by measuring elapsed time of the burst signal. Similarly, the RRH may monitor input power from the optical fiber and obtain power information by measuring the power level of the burst signal.

According to an aspect of a distortion compensation apparatus and a distortion compensation method disclosed in the present application, it is possible to achieve effects in sufficiently compensating burst distortion and improving distortion compensation performance.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus comprising:
a processor configured to
retain a distortion compensation coefficient for each of a plurality of time segments of a burst signal that keeps a constant power level, and
execute, by using a coefficient for a time segment that corresponds to elapsed time from a head of the burst signal among the coefficients retained, distortion compensation for the time segment; and
a transmitter that transmits the burst signal subjected to the distortion compensation by the processor.

2. The distortion compensation apparatus according to claim 1, wherein the processor is configured to retain, for each of the time segments, a coefficient group including a plurality of distortion compensation coefficients corresponding to a plurality of sample timings of the burst signal.

3. The distortion compensation apparatus according to claim 1, wherein the processor is configured to:
retain, for each of the time segments, a first distortion compensation coefficient for compensating a first distortion that changes according to the elapsed time from the head of the burst signal;
retain a second distortion compensation coefficient for compensating a second distortion being unrelated to the elapsed time from the head of the burst signal; and
combine the first distortion compensation coefficient for a time segment corresponding to the elapsed time from the head of the burst signal, among the first distortion compensation coefficients retained, with the second distortion compensation coefficient retained, and output a combined coefficient to execute the distortion compensation.

4. The distortion compensation apparatus according to claim 3, wherein the processor is further configured to update, based on the time segment of the burst signal before execution of the distortion compensation and based on an output of a power amplifier that amplifies the time segment after the execution of the distortion compensation, the first distortion compensation coefficient that corresponds to the time segment and that is retained.

5. The distortion compensation apparatus according to claim 4, wherein, based on the burst signal before the execution of the distortion compensation and based on the output of the power amplifier that amplifies the burst signal after the execution of the distortion compensation, the processor updates the second distortion compensation coefficient retained and updates the first distortion compensation coefficient after convergence of the second distortion compensation coefficient.

6. The distortion compensation apparatus according to claim 1, wherein the processor is configured to:
retain the distortion compensation coefficient for each of the plurality of time segments of the burst signal that keeps a constant first power level;
retain the distortion compensation coefficient for each of the plurality of time segments of the burst signal that keeps a constant second power level different from the constant first power level, and
execute, by using a distortion compensation coefficient for a time segment that corresponds to the elapsed time from the head of the burst signal among the distortion compensation coefficients corresponding to the constant power level of the burst signal, the distortion compensation of the time segment.

7. The distortion compensation apparatus according to claim 1, wherein the processor is further configured to update, based on the time segment of the burst signal before execution of the distortion compensation and based on an output of a power amplifier that amplifies the time segment after the execution of the distortion compensation, a coefficient that corresponds to the time segment and that is retained.

8. A distortion compensation method comprising:
obtaining a burst signal that keeps a constant power level; and
by using a coefficient for a time segment that corresponds to elapsed time from a head of the burst signal among coefficients retained for each of a plurality of time segments of the burst signal, executing, using a processor, distortion compensation for the time segment.

\* \* \* \* \*